United States Patent
Moyer et al.

(10) Patent No.: US 7,075,766 B2
(45) Date of Patent: Jul. 11, 2006

(54) FAULT DETECTION IN A LED BIAS CIRCUIT

(76) Inventors: Vincent C. Moyer, 1747 Tahoe Dr., Milpitas, CA (US) 95035; Michael John Brosnan, 38360 Nebo Ave., Fremont, CA (US) 94536

( * ) Notice: Subject to any disclaimer, the term of this patent is extended or adjusted under 35 U.S.C. 154(b) by 0 days.

(21) Appl. No.: 10/918,499

(22) Filed: Aug. 13, 2004

(65) Prior Publication Data

US 2006/0034027 A1    Feb. 16, 2006

(51) Int. Cl.
*H02H 3/08* (2006.01)
*H02H 9/02* (2006.01)
(52) U.S. Cl. .................................................. 361/93.1
(58) Field of Classification Search ............... 361/93.1, 361/93.7, 93.8; 324/767
See application file for complete search history.

(56) References Cited

U.S. PATENT DOCUMENTS

| 4,504,776 | A | * | 3/1985 | Haville ........................ 323/288 |
| 5,563,898 | A | * | 10/1996 | Ikeuchi et al. ............ 372/38.07 |
| 6,188,498 | B1 | * | 2/2001 | Link et al. .................. 398/195 |
| 6,704,183 | B1 | | 3/2004 | Stafford |
| 6,747,420 | B1 | * | 6/2004 | Barth et al. ................. 315/291 |

* cited by examiner

*Primary Examiner*—Brian Sircus
*Assistant Examiner*—Z Kitov

(57) ABSTRACT

The present invention detects single faults that would cause the current flowing through the light source to increase by a significant amount over the intended value. When the fault is a small leakage path to Ground potential from the light source cathode, it can be detected while maintaining operation of the light source within eye safety limits. In addition, the fault may be detected without activating the light source.

20 Claims, 4 Drawing Sheets

FAULT DETECTION IN A LED BIAS CIRCUIT

BACKGROUND

Products containing light emitting diodes (LEDs) or lasers that emit light in the visible or infrared range must conform to eye safety requirements, IEC 60825-1. If the optical flux that can impinge on a user's eye exceeds the standard, the device must be labeled an eye safety hazard, which is undesirable. This requirement applies not only during normal operation of the circuit but when predictable single faults occur in the circuit.

FIG. 1 illustrates a prior art eye safety circuit. This simple circuit uses a fuse. When the bias current exceeds the eye safety requirement, the fuse blows. FIG. 2 illustrates another prior art eye safety circuit. This circuit is a retriggerable transistor circuit that shunts current away from the LED when the current exceeds a design threshold.

The prior art circuits detect when the LED current is higher than some preset current. However, the circuit in FIG. 1 cannot detect a fault in which the LED cathode is connected to GROUND, and the fuse cannot be readily integrated onto an integrated circuit. The circuit in FIG. 2 can detect a fault where the LED cathode is shorted to Ground, but this circuit would be difficult to implement on a standard CMOS integrated circuit process.

As shown in FIG. 3, Kinoshita in "Semiconductor Laser Driving Device for Stabilizing the Optical Output Thereof", U.S. Pat. No. 4,884,280, issued 28 Nov. 1989, disclosed using a monitoring photodiode having an output indicative of the actual output of the laser. A comparator compares a reference signal indicative of a reference output level of the laser and the monitor photodiode signal. The comparator output signal reflects the change in the actual optical output level of the laser. An abnormal current eliminator controls the comparator output so that the signal has limited amplitude. Hence, the drive current to the laser is forcibly decreased to safe drive current levels.

As shown in FIG. 4, Stafford, in "Fault Detection in a LED Bias Circuit", U.S. Pat. No. 6,704,183, issued 9 Mar. 2004, assigned to Agilent Technologies, discloses using comparators at different points in the circuit. However, a small leakage path to Ground potential from the light emitting diode cathode will not be detected. This leakage current can be enough to cause the light emitting diode to operate outside of the eye safety limits. In addition, the light emitting diode must be active during the probing which can pose a safety hazard if excessive current does exist.

SUMMARY

The present invention detects single faults that would cause the current flowing through the light source to increase by a significant amount over the intended value. When the fault is a small leakage path to Ground potential from the light source cathode, it can be detected while maintaining operation of the light source within eye safety limits.

DETAILED DESCRIPTION

Figure 1:
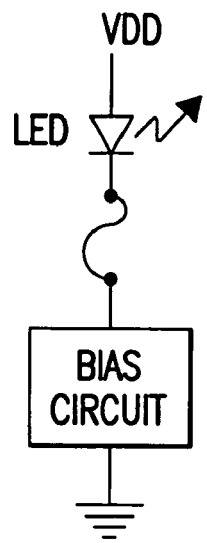
FIG. 1 illustrates a prior art eye safety circuit.
Figure 2:
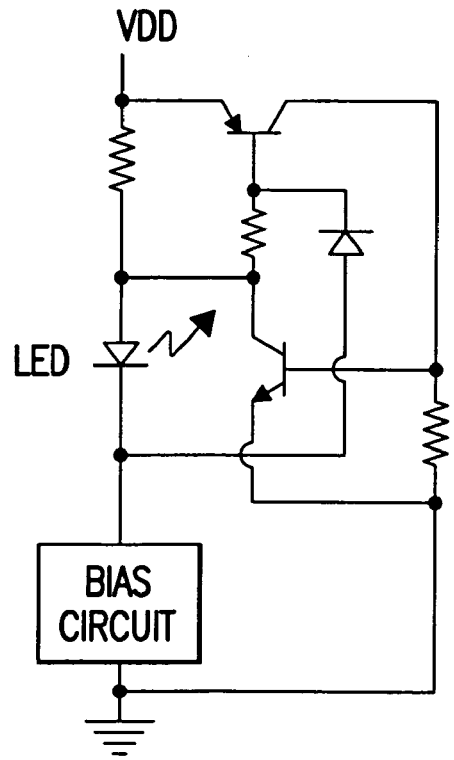
FIG. 2 illustrates another prior art eye safety circuit.
Figure 3:
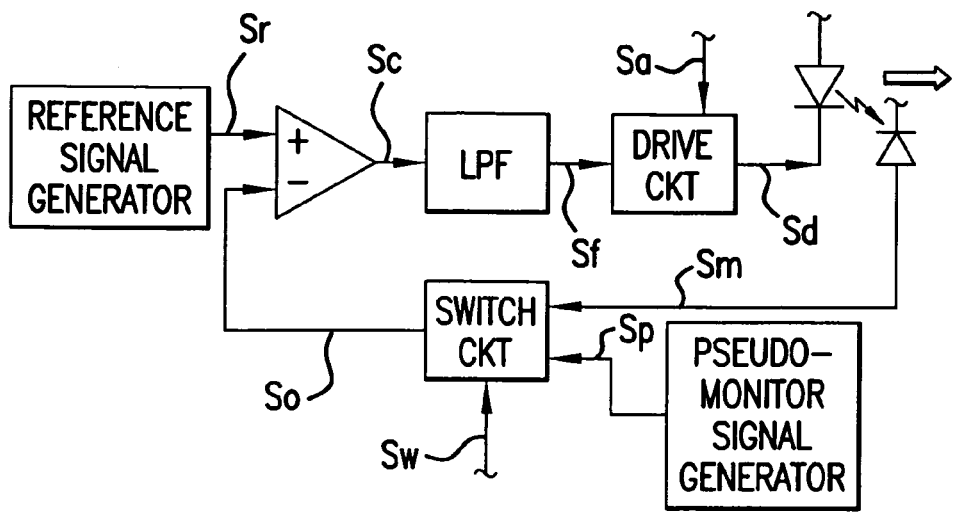
FIG. 3 illustrates another prior art eye safety circuit.
Figure 4:
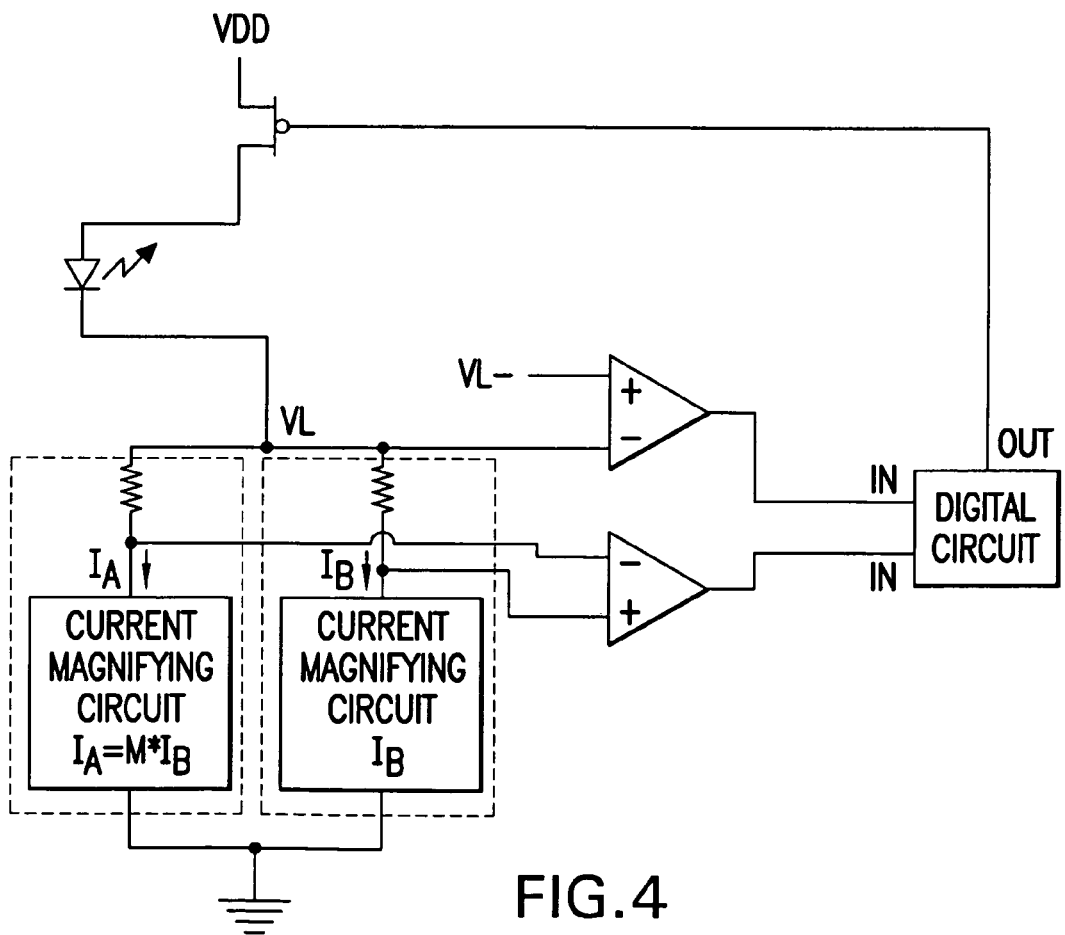
FIG. 4 illustrates another prior art eye safety circuit.
Figure 5:
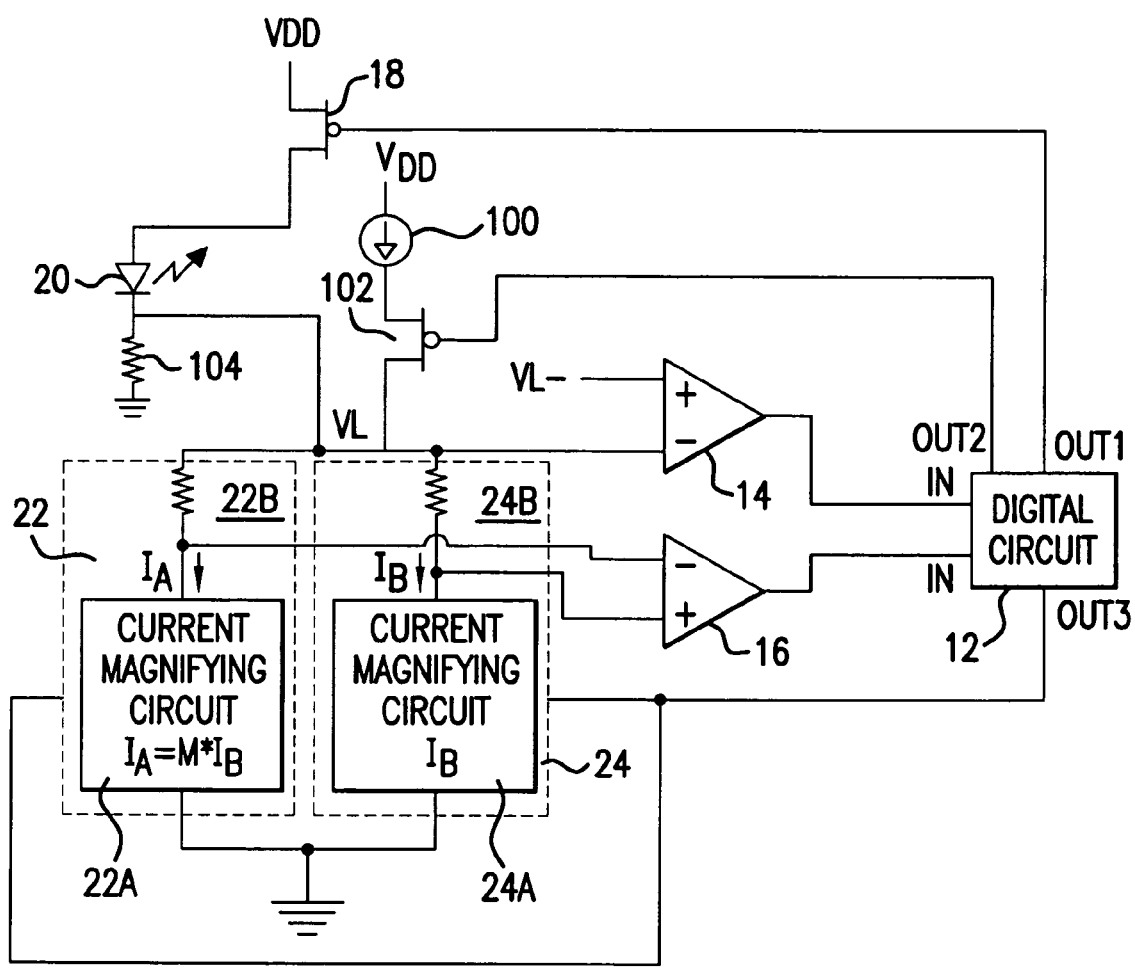
FIG. 5 illustrates an embodiment of the present invention.

FIG. 5 illustrates an embodiment of the present invention 10. A digital circuit 12 receives the output from two comparators 14, 16. Each comparator 14, 16 tests for a different fault. A first switch 18, e.g. a field effect transistor, interposes VDD and a light source, e.g. a light emitting diode or laser diode, 20. A controlled (active) or non-controlled (passive) current source 100 connects to VDD and a second switch 102, e.g. a field effect transistor, which is further connected to the light source. The input of the first switch 18 receives a first output of the digital circuit 12. The input of the second switch receives a second output of the digital circuit 12. Two bias current legs 22, 24, connected in parallel, connect between the light source 20 and Ground potential. Each bias current circuit 22, 24 contains a current sensing resistor 22B, 24B and a current magnifying circuit 22A, 24A connected in series.

Currents $I_A$ and $I_B$ are the currents in bias current legs 22, 24 respectively. Current magnifying circuits 22A and 24A work together to set the current $I_A$ equal to a multiple of $I_B$.

The negative input of comparator 14 is connected to node VL (the cathode of the LED 20), while the positive input of 14 is connected to a DC voltage source, VL-. The positive input of comparator 16 is connected to the negative end of current sensing resistor 24B, while the negative input of 16 is connected to the negative end of current sensing resistor 22B.

Resistor 104 indicates the short circuit or resistive path that may be detected by this circuit.

The circuit 10 is designed to detect single faults that would cause the current flowing through the light source 20 to increase by a significant amount over the intended value. There are two single fault conditions that this embodiment detects.

First, if the current magnifying circuit 22A fails in such a manner that its output current increases significantly, voltage across current sensing resistor 22B will be larger than voltage across current sensing resistor 24B, the output of comparator 16 will go high, the output of the digital circuit 12 will go high, and the switch 18 will be turned off. If current magnifying circuit 24A fails in such a manner that its output current increases significantly, the additional voltage drop across current sensing resistor 24B will limit the additional current so that the resulting increase in the total light source current is small enough so that the eye safety limit is not exceeded. Second, if voltage at node VL is much lower than expected (lower than VL-) such as could occur if node VL were shorted to ground, the output of comparator 14 will go high, the output of the digital circuit 12 will go high, and the switch 18 will be turned off.

To correctly detect the first or second fault, the light source 20 must be active so that current will flow through the sense resistors 221B, 24B and both sense voltages across current sensing resistors 22B and 24B will be non-zero. Node VL will be held above Ground potential by the voltage drop across the sense resistors and current magnifying circuit. If no current flows through the light source 20, a fault condition maybe incorrectly detected when no fault exists.

Detecting a short circuit or resistive path 104 from node VL to the Ground potential without activating the light source 20 occurs as follows. The digital circuit 12 disconnects the light source 20 from the power source by opening switch 18. The digital circuit 12 further places the current magnifying circuits 22A, 24A into a high impedance state via OUT3 and connects the current source 100 to node VL by closing the switch 102. If no resistive path 104 from node VL to Ground potential exists, the voltage at node VL will be pulled above the threshold VL- by the current source 100. If a resistive path 104 from node VL to Ground potential does exist, the voltage at node VL will be set by the value of the resistance and the magnitude of current source 100 as described by Equation 1.

$$V_{VL}=I_{100}*R_{104}$$ Equation 1

If the voltage at node VL does not exceed the reference voltage VL-, the comparator 14 output goes high and a fault is detected. The value of resistance 104 that is to be detected as a fault may be pre-determined by setting the magnitude of current source 100. Therefore, a fault that does not cause the light source 20 output to exceed eye safety limits may be detected by careful selection of the current source 20 and the voltage threshold VL-. In addition, a fault may be detected without activating the light source 20.

Figure 6:
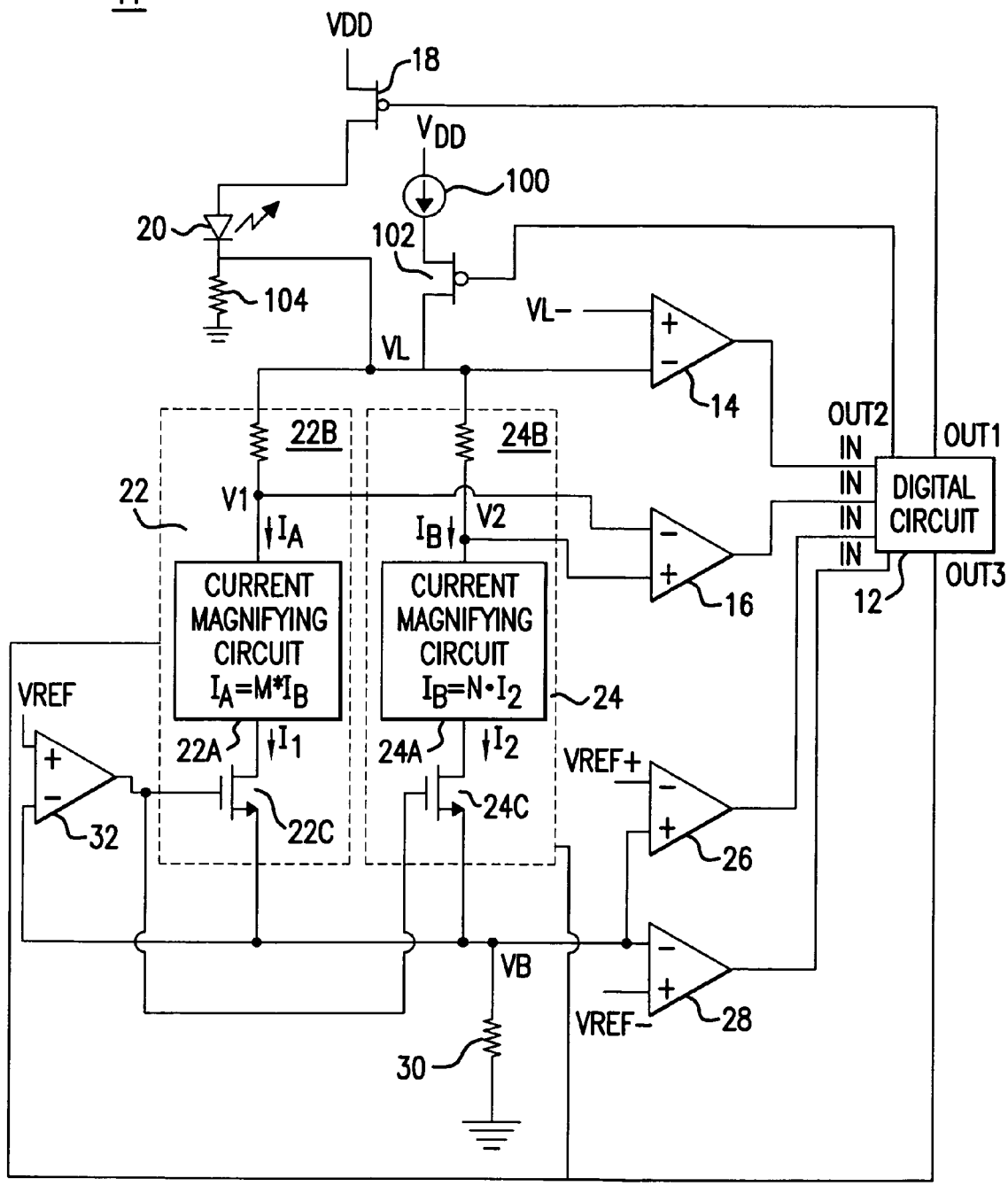
FIG. 6 illustrates an alternate embodiment of the present invention.

FIG. 6 illustrates an alternative embodiment of the present invention 11. A digital circuit receives the output from four comparators 14, 16, 26, 28. Each comparator tests for a different fault condition. A first switch 18, e.g. a field effect transistor, interposes VDD and a light source, e.g. light emitting diode or laser diode 20. The input of the first switch 18 receives the first output of the digital circuit 12. A controlled (active) or non-controlled (passive) current source 100 connects between VDD and a second switch that is further connected to the light source. The input of the second switch 102, e.g. a field effect transistor, receives the second output of the digital circuit. Two bias current legs 22, 24, connected in parallel, connect between the light source 20 and a bias resistor 30. The opposing end of bias resistor 30 is connected to ground. The bias current legs 22, 24 are connected to each of the comparators 14, 16, 26, 28. For comparator 14, the negative input is connected to the output of the bias current legs 22, 24 and the positive input receives DC voltage VL-. For comparator 16, the positive and negative inputs are connected differentially to nodes within the bias current legs 22, 24. For comparator 26, the negative input receives a DC voltage VREF+, while the positive input is connected to node VB. For comparator 28, the negative input is connected to the input of the bias current legs 22, 24 and the positive input receives DC voltage source VREF−. The positive input of amplifier 32 receives DC voltage source VREF. The output of amplifier 32 is connected to the bias current legs 22, 24 while the negative input is connected to node VB.

Each bias current leg 22, 24 includes a current-sensing resistor 22B, 24B interposing the light source 20 and a current magnifying circuit 22A, 24A. A transistor 22C, 24C, e.g. a field effect transistor, has a drain connected to the current magnifying circuit, a gate connected to the amplifier output, and a source connected to the bias resistor (RB) 30.

During normal operation (no fault), the amplifier 32 and the transistors 22G, 24C form a feedback loop that forces node VB to be at the same voltage as the reference voltage signal VRBF. Thus, the combined current through these transistors will be I=VREF/RB, where RB is the value of the bias resistor 30. If the transistors are of the same size, then their currents, $I_1$ and $I_2$, will be the same. Currents $I_1$ and $I_2$ are scaled up by the current magnifying circuits 22A, 24A so that the output currents $I_A$ and $I_B$ are in the ratio of M:N, where M>>N. These bias currents flow through the current-sensing resistors 22B, 24B and the combined current flows through the LED 20 and the switch 18. The current through the LED 20 (and hence its light output) is set by selecting the value of the bias resistor (RB) 30 and the value of VREF. The circuit is designed to detect single faults that would cause the current flowing though the LED to increase by a significant amount over the intended value.

Fault detection to identify the resistive path 104 occurs as was described for FIG. 5.

We claim:

1. A circuit comprising:
   a first switch, connected to power, having an input;
   a light source connected to the first switch;
   a current source, connected to power;
   a second switch connected to the current source and the light source, having an input;
   two bias current legs, electrically connected in parallel, interposing the light source and ground;
   a first comparator, having a first input connected to the light source and a second input that receives a reference voltage signal;
   a second comparator, having a first input connected to one of the bias current legs and a second input connected to another of the bias current legs; and
   a drive circuit, having outputs connected to the input of the first switch, the input of the second switch, and the bias current legs, receiving an output from the first and second comparators.

2. The circuit, as in claim 1, each bias current leg including:
   a current-sensing resistor connected to the light source; and
   a current magnifying circuit, connected to the current-sensing resistor.

3. The circuit as in claim 1, further comprising:
   a bias resistor interposing the bias current legs and ground;
   an amplifier, having a first input receiving a voltage reference signal, a second input connected to the bias resistor, and an output connected to the bias legs; and
   a third comparator, having a first input receiving a high voltage signal, having a second input connected to the bias resistor; and
   the drive circuit further receiving the output from the third comparator.

4. The circuit, as in claim 3, further comprising:
   a fourth comparator, having a first input connected to the bias resistor and a second input receiving a low voltage signal; and
   the drive circuit, further receiving the output from the fourth comparator.

5. The circuit, as in claim 3, each bias current leg including:
   a current-sensing resistor connected to the light emitting diode;
   a current magnifying circuit, connected to the current-sensing resistor; and
   a transistor, providing an output to the current magnifying circuit, an input connected to the amplifier output, and an input connected to the bias resistor.

6. The circuit, as in claim 5, wherein the transistor is a field effect transistor.

7. The circuit, as in claim 6, wherein the field effect transistors for the two bias current legs have the same size.

8. The circuit, as in claim 1, further comprising a substrate that includes the switches, the bias current legs, the first and second comparators, and the drive circuit.

9. The circuit, as in claim 8, each bias current leg including:
  a current-sensing resistor connected to the light source; and
  a current magnifying circuit, connected to the current-sensing resistor.

10. The circuit, as in claim 8, further comprising:
  a bias resistor interposing the bias current legs and ground;
  an amplifier, having a first input receiving a voltage reference signal, a second input connected to the bias resistor, and an output connected to both bias legs;
  a third comparator, having a first input receiving a high voltage signal, having a second input connected to the bias resistor;
  the drive circuit, further receiving the output from the third comparator; and
  wherein the substrate includes the amplifier and the third comparator.

11. The circuit, as in claim 10, further comprising a fourth comparator, positioned on the substrate, having a first input connected to the bias resistor and a second input receiving a low voltage signal.

12. The circuit, as in claim 10, each bias current leg including:
  a current-sensing resistor connected to the light source;
  a current magnifying circuit, connected to the current sensing resistor; and
  a transistor, providing an output to the current magnifying circuit, an input connected to the amplifier output, and an input connected to the bias resistor.

13. The circuit, as in claim 12, wherein the transistor is a field effect transistor.

14. The circuit, as in claim 13, wherein the field effect transistors for the two bias current legs have the same size.

15. The circuit, as in claim 1, wherein the first comparator and the second comparator are adapted to determine a fault when the light source is turned off.

16. A circuit comprising:
  a first switch connected to power, having an input,
  a light source adapted to receive power from the first switch;
  a current source, connected to power;
  a second switch connected to the current source and the light source, having an input;
  two bias current legs, electrically connected in parallel, interposing the light source and ground;
  a first comparator, having a first input connected to the light source and a second input that receives a reference voltage signal;
  a second comparator, having a first input connected to one of the bias current legs and a second input connected to another of the bias current legs; and
  a drive circuit, having outputs connected to the input of the first switch, the input of the second switch, and the bias current legs, receiving an output from the first and second comparators;
  wherein the output of the first comparator and the second comparator are generated in response to a fault condition in the circuit; and
  wherein the first switch and the second switch are turned on in response to output of the drive circuit.

17. The circuit as in claim 16, wherein the first comparator and the second comparator are adapted to determine a fault when the light source is turned off.

18. A method of fault detection in a circuit, the method comprising:
  passing a voltage signal across a first switch connected to a light source;
  passing a current signal across a second switch connected to a first bias current leg and a second bias current leg;
  comparing an output voltage at the first bias current leg and an output voltage at the second bias current leg using a first comparator;
  comparing an output voltage at the light source and a reference voltage using a second comparator; and
  turning off the first switch and the second switch in response to determining the fault.

19. The method of claim 18, wherein determining the fault based on the output of the first comparator and the second comparator is performed when the light source is turned on.

20. The method of claim 18, wherein determining the fault based on the output of the first comparator and the second comparator is performed when the light source is turned off.

* * * * *